(12) United States Patent
Lin

(10) Patent No.: US 12,014,953 B2
(45) Date of Patent: Jun. 18, 2024

(54) SEMICONDUCTOR DEVICE MITIGATING PARASITIC CAPACITANCE AND METHOD OF FABRICATING THE SAME

(71) Applicant: WUHAN XINXIN SEMICONDUCTOR MANUFACTURING CO., LTD., Hubei (CN)

(72) Inventor: Fei Lin, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 171 days.

(21) Appl. No.: 17/555,844

(22) Filed: Dec. 20, 2021

(65) Prior Publication Data

US 2023/0056408 A1  Feb. 23, 2023

(30) Foreign Application Priority Data

Aug. 20, 2021  (CN) .......................... 202110961312.9

(51) Int. Cl.
*H01L 21/768* (2006.01)
*H01L 23/00* (2006.01)
(Continued)

(52) U.S. Cl.
CPC .... *H01L 21/7682* (2013.01); *H01L 21/76831* (2013.01); *H01L 21/76832* (2013.01);
(Continued)

(58) Field of Classification Search
CPC ......... H01L 21/76831; H01L 21/76832; H01L 21/76898; H01L 23/481; H01L 2224/0557;
(Continued)

(56) References Cited

U.S. PATENT DOCUMENTS

2009/0085173 A1  4/2009  Boemmels et al.
2010/0052110 A1  3/2010  Seidel et al.
(Continued)

FOREIGN PATENT DOCUMENTS

CN  101771018 A  7/2010
CN  104900584 A  9/2015
(Continued)

*Primary Examiner* — Mamadou L Diallo
(74) *Attorney, Agent, or Firm* — MUNCY, GEISSLER, OLDS & LOWE, PC

(57) ABSTRACT

A semiconductor device and a method of fabricating the semiconductor device are disclosed. The method includes: providing a first wafer including a substrate; forming a hole in the first wafer, which extends through the substrate; forming an insulating dielectric layer over a side wall of the hole; filling the hole with a conductive layer; removing at least part of the insulating dielectric layer situated in correspondence with the substrate, forming an air gap between the conductive layer and the substrate; and forming a closure layer, which closes the air gap. With the present invention, parasitic capacitance present between the conductive layer, the insulating dielectric layer and the substrate is significantly reduced, resulting in an improvement in performance of the semiconductor device.

20 Claims, 6 Drawing Sheets

(51) Int. Cl.
 *H01L 23/48* (2006.01)
 *H01L 25/00* (2006.01)
 *H01L 25/065* (2023.01)

(52) U.S. Cl.
 CPC ...... *H01L 21/76898* (2013.01); *H01L 23/481* (2013.01); *H01L 24/05* (2013.01); *H01L 25/0657* (2013.01); *H01L 25/50* (2013.01); *H01L 2224/05009* (2013.01); *H01L 2224/0557* (2013.01); *H01L 2224/05573* (2013.01); *H01L 2225/06544* (2013.01)

(58) Field of Classification Search
 CPC ....... H01L 2225/06541; H01L 21/7682; H01L 2221/1047
 See application file for complete search history.

(56) References Cited

U.S. PATENT DOCUMENTS

| | | | | |
|---|---|---|---|---|
| 2010/0323505 | A1* | 12/2010 | Ishikawa | H01L 21/0273 257/E21.21 |
| 2012/0074584 | A1 | 3/2012 | Lee et al. | |
| 2012/0161310 | A1 | 6/2012 | Brindle et al. | |
| 2013/0115769 | A1* | 5/2013 | Yu | H01L 21/76898 257/E21.597 |
| 2014/0264729 | A1* | 9/2014 | Lee | H01L 21/76805 257/522 |
| 2014/0308794 | A1* | 10/2014 | Lee | H01L 23/498 438/653 |
| 2015/0243639 | A1* | 8/2015 | How | H01L 23/481 257/676 |
| 2019/0221475 | A1* | 7/2019 | Hong | H01L 21/76835 |
| 2020/0020567 | A1* | 1/2020 | Sun | H01L 21/26586 |
| 2020/0035542 | A1* | 1/2020 | Dong | H01L 21/76224 |
| 2021/0098365 | A1* | 4/2021 | Chou | H01L 21/76819 |
| 2021/0249519 | A1* | 8/2021 | Yao | H01L 29/66545 |
| 2022/0084885 | A1* | 3/2022 | Han | H01L 21/76898 |
| 2022/0139808 | A1* | 5/2022 | Wu | H01L 23/3677 257/712 |
| 2022/0310441 | A1* | 9/2022 | Su | H01L 21/7685 |
| 2022/0319923 | A1* | 10/2022 | Wang | H01L 23/481 |
| 2022/0319958 | A1* | 10/2022 | Wang | H01L 23/481 |
| 2022/0319959 | A1* | 10/2022 | Wang | H01L 21/76898 |
| 2022/0320005 | A1* | 10/2022 | Wang | H01L 21/76831 |
| 2022/0406647 | A1* | 12/2022 | Chou | H01L 21/76807 |
| 2023/0084374 | A1* | 3/2023 | Kim | H01L 29/40117 |

FOREIGN PATENT DOCUMENTS

| | | |
|---|---|---|
| CN | 109148361 A | 1/2019 |
| CN | 110098175 A | 8/2019 |
| WO | WO-2012041034 A1 * | 4/2012 ....... H01L 21/76898 |

* cited by examiner

SEMICONDUCTOR DEVICE MITIGATING PARASITIC CAPACITANCE AND METHOD OF FABRICATING THE SAME

CROSS-REFERENCES TO RELATED APPLICATION

This application claims the priority of Chinese patent application number 202110961312.9, filed on Aug. 20, 2021, the entire contents of which are incorporated herein by reference.

TECHNICAL FIELD

The present invention relates to the field of semiconductor integrated circuit (IC) fabrication, more particularly to a semiconductor device and a method of fabricating the semiconductor device.

BACKGROUND

In the field of semiconductor technology, parasitic capacitance has been being one of the factors that limit performance improvement of some devices. The through silicon via (TSV) technique is an important part of, for example, the formation of devices developed based on three-dimensional (3D) IC packaging.

At present, the TSV technique is often used for metal interconnection or backside bonding during the bonding of different wafers. In applications requiring metal interconnection between wafers to be bonded together, the TSV technique can be used to form hole plugs extending through substrates of the wafers. Such a hole plug includes an insulating dielectric layer on a side wall of the hole and a conductive layer filled in the hole, which is insulated from the substrate by the insulating dielectric layer. However, between the conductive layer, the insulating dielectric layer and the substrate, there may be parasitic capacitance that can degrade the performance of the semiconductor device being fabricated. Moreover, the insulating dielectric layer is typically made of silicon oxide or another high-k dielectric material, which can increase parasitic capacitance. Further, a larger area of the conductive layer surrounded by the substrate tends to suffer from greater parasitic capacitance.

Therefore, currently, there is an urgent need for improving the performance of a semiconductor device by mitigating parasitic capacitance between conductive layers and a substrate therein.

SUMMARY OF THE INVENTION

It is an objective of the present invention to provide a semiconductor device with significantly mitigated parasitic capacitance between conductive layers, insulating dielectric layers and a substrate therein and thus improved performance, as well as a method of fabricating such a semiconductor device.

The above objective is attained by a method of fabricating a semiconductor device, which includes:
  providing a first wafer including a substrate;
  forming a hole in the first wafer, which extends through the substrate;
  forming an insulating dielectric layer over a side wall of the hole;
  filling the hole with a conductive layer;
  removing at least part of the insulating dielectric layer situated in correspondence with the substrate, forming an air gap between the conductive layer and the substrate; and
  forming a closure layer, which closes the air gap.

Optionally, the insulating dielectric layer may be a single-layer structure or a stack of at least two layers.

Optionally, in case of the insulating dielectric layer being a stack of at least two layers, a portion of any of the layers situated in correspondence with the substrate may be removed.

Optionally, the insulating dielectric layer may include, stacked sequentially over the side wall of the hole, a first silicon oxide layer, a silicon nitride layer and a second silicon oxide layer, wherein a portion of the silicon nitride layer in the insulating dielectric layer in correspondence with the substrate is removed.

Optionally, in the air gap, the substrate may be exposed, or the conductive layer may be exposed, or both the substrate and the conductive layer may be exposed, or neither the substrate nor the conductive layer may be exposed.

Optionally, the closure layer may reside on the first wafer.

Optionally, the method may further include, prior to the formation of the hole in the first wafer,
  providing a second wafer and bonding the first wafer to the second wafer.

The above object is also attained by a semiconductor device provided in the present invention, which includes:
  a first substrate;
  a hole extending through the first substrate;
  an insulating dielectric layer covering a side wall of the hole;
  a conductive layer filled in the hole, wherein at least part of the insulating dielectric layer in correspondence with the substrate is removed, forming an air gap between the conductive layer and the substrate; and
  a closure layer, which closes the air gap.

Optionally, the insulating dielectric layer may be a single-layer structure or a stack of at least two layers.

Optionally, in case of the insulating dielectric layer being a stack of at least two layers, a portion of any of the layers situated in correspondence with the substrate may be removed so that the air gap is present in this layer.

Optionally, the insulating dielectric layer may include, stacked sequentially over the side wall of the hole, a first silicon oxide layer, a silicon nitride layer and a second silicon oxide layer, wherein the air gap is present in the silicon nitride layer in the insulating dielectric layer.

Optionally, in the air gap, the substrate may be exposed, or the conductive layer may be exposed, or both the substrate and the conductive layer may be exposed, or neither the substrate nor the conductive layer may be exposed.

Optionally, the closure layer may reside on the first wafer.

Optionally, the semiconductor device may further include:
  a first die containing the first substrate; and
  a second die bonded to the first die.

The present invention is advantageous over the prior art as follows:

1. In the method, after a hole extending through the substrate of the first wafer is formed, an insulating dielectric layer covering a side wall of the hole is formed, and a conductive layer is filled in the hole. After that, at least part of the insulating dielectric layer situated in correspondence with the substrate is removed, resulting in the formation of an air gap between the conductive layer and the substrate. Replacing at least part of the insulating dielectric layer situated in correspondence with the substrate with the air gap having a lower dielectric constant results in a significant reduction in parasitic capacitance between the conductive layer, the insulating dielectric layer and the substrate and thus in an improvement in the performance of the semiconductor device being fabricated.

2. In the semiconductor device, a hole extending through the first substrate is formed, and a side wall of the hole is covered with an insulating dielectric layer. A conductive layer is filled in the hole, and at least part of the insulating dielectric layer situated in correspondence with the substrate is removed, resulting in the formation of an air gap between the conductive layer and the substrate. Replacing at least part of the insulating dielectric layer situated in correspondence with the substrate with the air gap having a lower dielectric constant results in a significant reduction in parasitic capacitance between the conductive layer, the insulating dielectric layer and the substrate and thus in an improvement in the performance of the semiconductor device.

BRIEF DESCRIPTION OF THE DRAWINGS

In FIGS. 1 to 3c,

11—first substrate; 111—insulating material layer; 12—first insulating layer; 121—first metal interconnect; 131—first hole; 132—second hole; 133—first opening; 134—second opening; 14—insulating dielectric layer; 141—first silicon oxide layer; 142—silicon nitride layer; 143—second silicon oxide layer; 15—conductive layer; 16—air gap; 17—closure layer; 21—second substrate; 22—second insulating layer; 221—second metal interconnect.

DETAILED DESCRIPTION

Objectives, advantages and features of the present invention will become more apparent from the following detailed description of the semiconductor device and method proposed herein, which is to be read in connection with the accompanying drawings. Note that the figures are provided in a very simplified form not necessarily drawn to exact scale for the only purpose of helping to explain the embodiments disclosed herein in a more convenient and clearer way.

Figure 1:
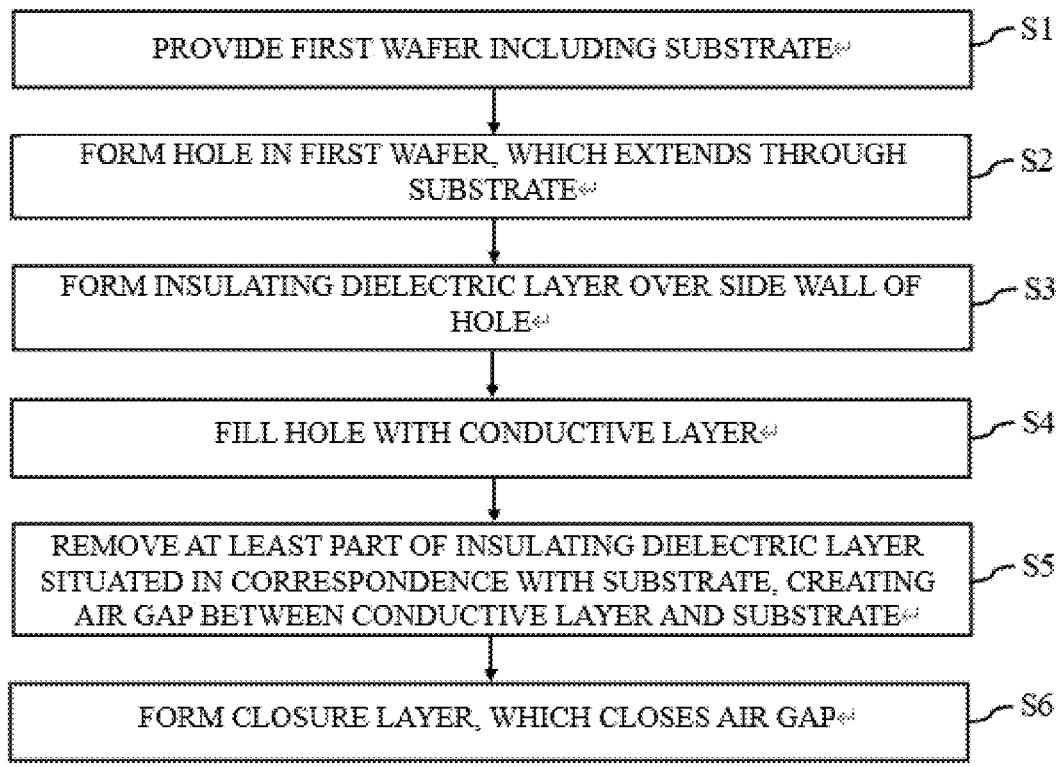
FIG. 1 is a flowchart of a method of fabricating a semiconductor device according to an embodiment of the present invention.

Reference is now made to FIG. 1, a flowchart of a method of fabricating a semiconductor device according to an embodiment of the present invention. As shown in FIG. 1, the method includes the steps of:

S1) providing a first wafer including a substrate;
S2) forming a hole in the first wafer, which extends through the substrate;
S3) forming an insulating dielectric layer over a side wall of the hole;
S4) filling the hole with a conductive layer;
S5) removing at least part of the insulating dielectric layer situated in correspondence with the substrate, forming an air gap between the conductive layer and the substrate; and
S6) forming a closure layer, which closes the air gap.

The method according to this embodiment will be described in greater detail below with reference to the schematic longitudinal cross-sectional views shown in FIGS. 2a to 2g and 3a to 3c.

Figure 2A:
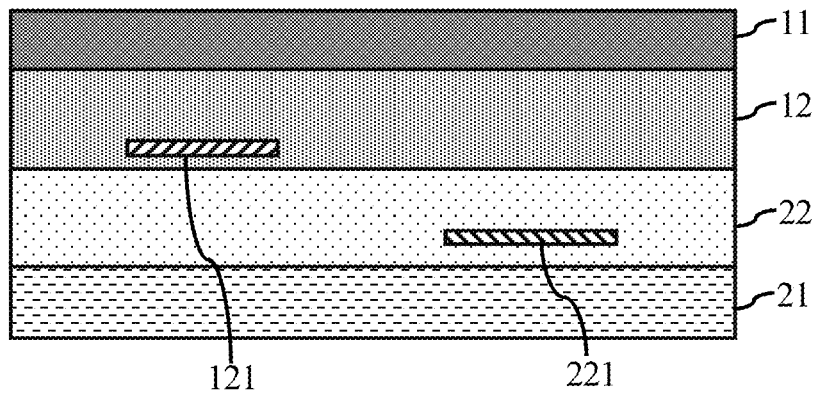
FIGS. 2a to 2g are schematic illustrations of structures resulting from steps in the method of FIG. 1.

Referring to FIG. 2a, in step S1, the first wafer including the substrate is provided.

The first wafer may further include an insulating layer on a front side of the substrate. In order to distinguish the substrate and the insulating layer of the first wafer from the substrate and the insulating layer of the subsequently provided second wafer, the substrate and the insulating layer of the first wafer are referred to hereinafter as the first substrate 11 and the first insulating layer 12, respectively, while the substrate and the insulating layer of the second wafer are referred to hereinafter as the second substrate 21 and the second insulating layer 22, respectively.

The first substrate 11 may be formed of any suitable semiconductor material. Examples of the material may include, but are not limited to, silicon, germanium, silicon germanium, silicon germanium carbide, silicon carbide and other semiconductor materials.

In the first insulating layer 12, there may be formed a first metal interconnect 121 and, optionally, a functional component such as a pixel array, a transistor or an MEMS device (e.g., a diaphragm, an electrode, etc.)

The first wafer may be a device wafer such as a pixel wafer containing a pixel array of an image sensor. The type of the first wafer is determined by functionality of the device being fabricated.

In step S2, the hole extending through the first substrate 11 is formed in the first wafer.

Referring to FIG. 2a, prior to the formation of the hole in the first wafer, the method may further include:

providing a second wafer; and bonding the first wafer to the second wafer. The bonding of the first wafer to the second wafer may be accomplished by bonding layer(s) on the first wafer and/or the second wafer.

The second wafer may not contain any functional component, and may serve only to support the first wafer. Alternatively, the second wafer may also be a device wafer containing MOS transistors, resistors, capacitors, metal interconnects or other structures. The present invention is not limited to any particular material or device functionality of the second wafer.

Referring to FIG. 2a, the second wafer may include a second substrate 21 and a second insulating layer 22 on a front side of the second substrate 21. In the second insulating layer 22, there may be formed a second metal interconnect 221.

The first wafer may be bonded to the second wafer so that the first insulating layer 12 is closer to the second wafer than the first substrate 11 or that the first substrate 11 is closer to the second wafer than the first insulating layer 12.

Moreover, the first wafer may be bonded to the second wafer so that the second insulating layer 22 is closer to the first wafer than to the second substrate 21 or that the second substrate 21 is closer to the first wafer than the second insulating layer 22.

Figure 2B:
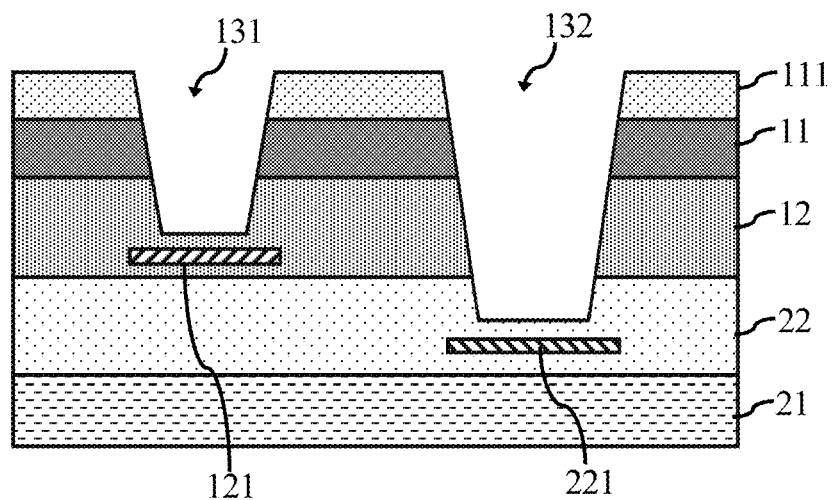

In case of the first insulating layer 12 being closer to the second wafer than the first substrate 11, the hole may extend through at least the first substrate 11. That is, the hole may extend through the first substrate 11, or through the first substrate 11 and a partial thickness of the first insulating layer 12, or through the first substrate 11, the first insulating layer 12 and a partial thickness of the second wafer. Referring to FIG. 2b, the step of forming the hole in the first wafer may include the following sub-steps.

At first, an insulating material layer 111 is deposited on the side of the first substrate 11 away from the first insulating layer 12 (i.e., the backside of the first substrate 11). The insulating material layer 111 can provide protection to the first substrate 11 during the later etching thereof.

Subsequently, the insulating material layer 111, the first substrate 11 and, optionally, a partial thickness of the first insulating layer 12 may be sequentially etched to form the hole (referred to hereinafter as the "first hole" 131 in order to be distinguished from holes formed in other embodiments). In this case, the first hole 131 extends sequentially through the insulating material layer 111, the first substrate 11 and, optionally, a partial thickness of the first insulating layer 12, and the first metal interconnect 121 may not be exposed in the first hole 131 (i.e., still separated from the first hole 131 by the remaining thickness of the first insulating layer 12). Alternatively, the insulating material layer 111, the first substrate 11, the first insulating layer 12 and, optionally, a partial thickness of the second wafer, may be sequentially etched to form the hole ("second hole" 132). In this case, the second hole 132 extends sequentially through the insulating material layer 111, the first substrate 11, the first insulating layer 12 and, optionally, a partial thickness of the second wafer, and the second metal interconnect 221 may not be exposed in the second hole 132 (i.e., still separated from the second hole 132 by the remaining thickness of the second wafer). In case of the second insulating layer 22 being closer to the first wafer than the second substrate 21, the second hole 132 is still separated from the second metal interconnect 221 by a remaining thickness of the second insulating layer 22. Only the first hole 131, only the second hole 132, or both the first and second holes 131, 132 may be formed in the first wafer.

In addition, in case of the first substrate 11 being closer to the second wafer than the first insulating layer 12, the hole may extend through the first insulating layer 12 and the first substrate 11, or through the first insulating layer 12, the first substrate 11 and a partial thickness of the second wafer. In this case, the step of forming the hole in the first wafer may include the following sub-steps.

At first, an insulating material layer 111 is deposited on the side of the first insulating layer 12 away from the first substrate 11.

Subsequently, the insulating material layer 111, the first insulating layer 12, the first substrate 11 and, optionally, a partial thickness of the second wafer may be sequentially etched to form the hole ("third hole", not shown). In this case, the third hole extends sequentially through the insulating material layer 111, the first insulating layer 12, the first substrate 11 and, optionally, a partial thickness of the second wafer, and the second metal interconnect 221 may not be exposed in the third hole. In case of the second insulating layer 22 being closer to the first wafer than the second substrate 21, the third hole still separated from the second metal interconnect 221 by a remaining thickness of the second insulating layer 22.

It is to be noted that, in the step of forming the hole in the first wafer, the first metal interconnect 121 may alternatively be exposed in the first hole 131, or the second metal interconnect 221 may alternatively be exposed in the second 132 or third hole.

Figure 2C:
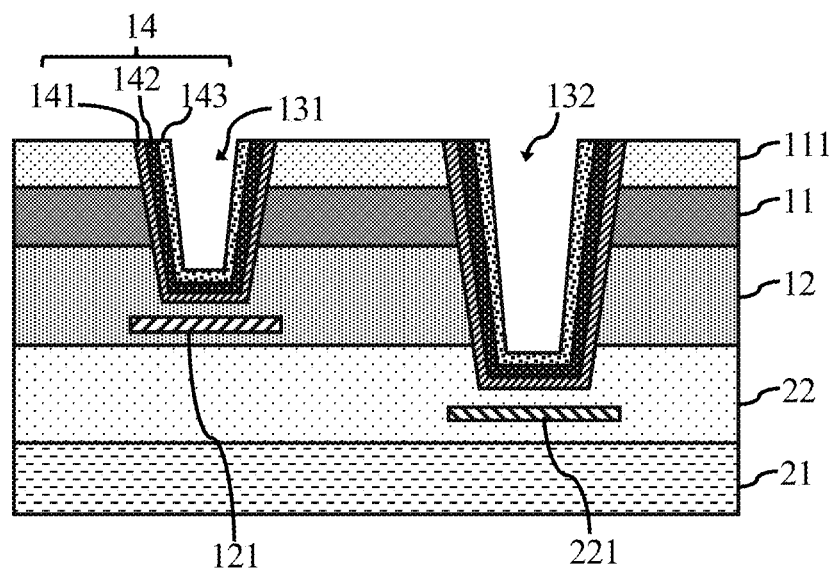
Figure 2D:
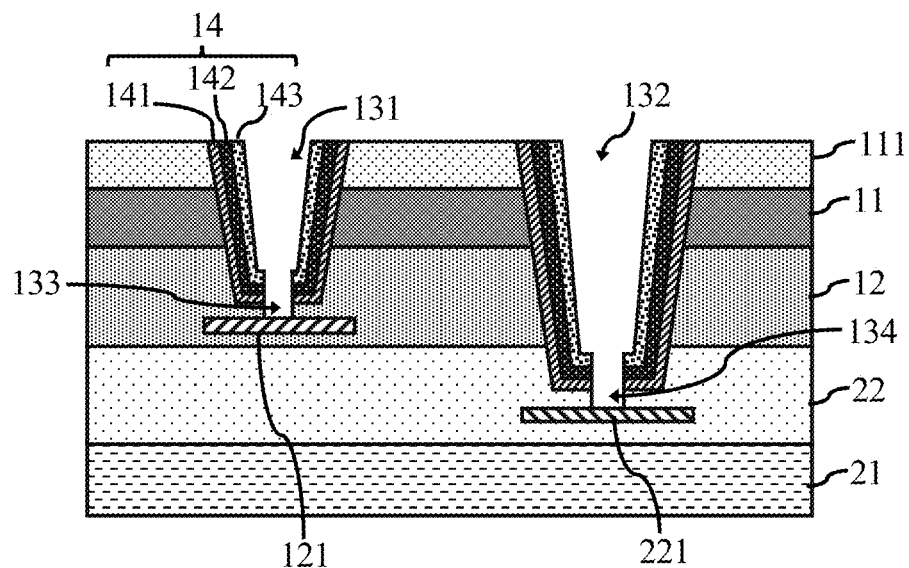

In step S3, referring to FIGS. 2c to 2d, the insulating dielectric layer 14 covering the side wall of the hole is formed.

The insulating dielectric layer 14 may be formed of a material selected as one or at least two of silicon oxide, silicon nitride, silicon oxynitride, nitrogen-doped silicon carbide and silicon carbide.

The insulating dielectric layer 14 may consist of either a single layer or a stack of at least two layers. In the embodiment illustrated in FIGS. 2c-2d, the insulating dielectric layer 14 is a tri-layer structure including a first silicon oxide layer 141, a silicon nitride layer 142 and a second silicon oxide layer 143, stacked sequentially on the side wall of the hole.

In case of the first hole 131 extending through the insulating material layer 111, the first substrate 11 and, optionally, a partial thickness of the first insulating layer 12 while being separated from the first metal interconnect 121 by the remaining thickness of the first insulating layer 12, the step of forming the insulating dielectric layer 14 covering the side wall of the first hole 131 may include the following sub-steps.

Initially, as shown in FIG. 2c, the insulating dielectric layer 14 covers both the side wall and a bottom wall of the first hole 131.

Subsequently, as shown in FIG. 2d, the insulating dielectric layer 14 on the bottom wall of the first hole 131 and the first insulating layer 12 between the first hole 131 and the first metal interconnect 121 are etched away, forming a first opening 133 in which the first metal interconnect 121 is exposed.

Alternatively, in case of the second hole 132 extending sequentially through the insulating material layer 111, the first substrate 11, the first insulating layer 12 and, sequentially, a partial thickness of the second wafer while being separated from the second metal interconnect 221 by the remaining thickness of the second wafer, the step of forming the insulating dielectric layer 14 covering the side wall of the second hole 132 may include the following sub-steps.

Initially, as shown in FIG. 2c, the insulating dielectric layer 14 covers both the side and bottom wall of the second hole 132.

Subsequently, as shown in FIG. 2d, the insulating dielectric layer 14 on the bottom wall of the second hole 132 and the second wafer between the second hole 132 and the second metal interconnect 221 are etched away, forming a second opening 134 in which the second metal interconnect 221 is exposed.

Alternatively, in case of the third hole extending sequentially through the insulating material layer 111, the first insulating layer 12, the first substrate 11 and, optionally, a partial thickness of the second wafer, a similar process as with the case of the second hole 132 can be performed to form the insulating dielectric layer 14 covering the side wall of the third hole and a third opening (not shown) in which the second metal interconnect 221 is exposed.

Further, in the alternative embodiments with the first metal interconnect 121 being initially exposed in the first hole 131 or with the second metal interconnect 221 being initially exposed in the second 132 or third hole, the first 133, second 134 or third opening may be formed simply by etching away the insulating dielectric layer 14 on the bottom wall of the first 131, second 132 or third hole.

Figure 2E:
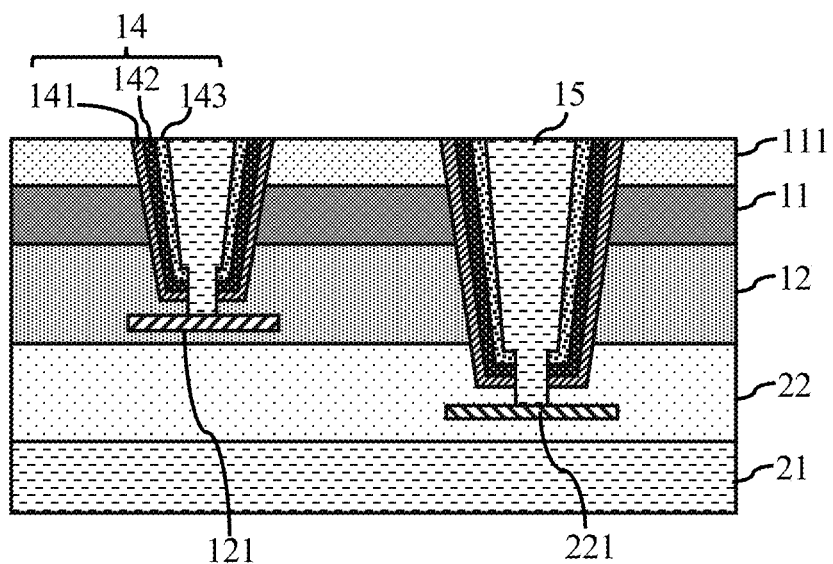

In step S4, referring to FIG. 2e, the hole is filled with the conductive layer 15. As a result, when the conductive layer 15 is energized, parasitic capacitance will be present between the first substrate 11, the conductive layer 15 and the insulating dielectric layer 14 sandwiched by the first substrate 11 and the conductive layer 15.

The conductive layer 15 also fills the first opening 133, electrically connecting the conductive layer 15 in the first hole 131 and the first opening 133 to the first metal interconnect 121. Alternatively, the conductive layer 15 may also fill up the second opening 134, electrically connecting the conductive layer 15 in the second hole 132 and the second opening 134 to the second metal interconnect 221. Alternatively, the conductive layer 15 may also fill up the third opening, electrically connecting the conductive layer 15 in the third hole and the third opening to the second metal interconnect 221.

The conductive layer 15 may be formed by depositing, planarizing and etching a conductive material.

Figure 2F:
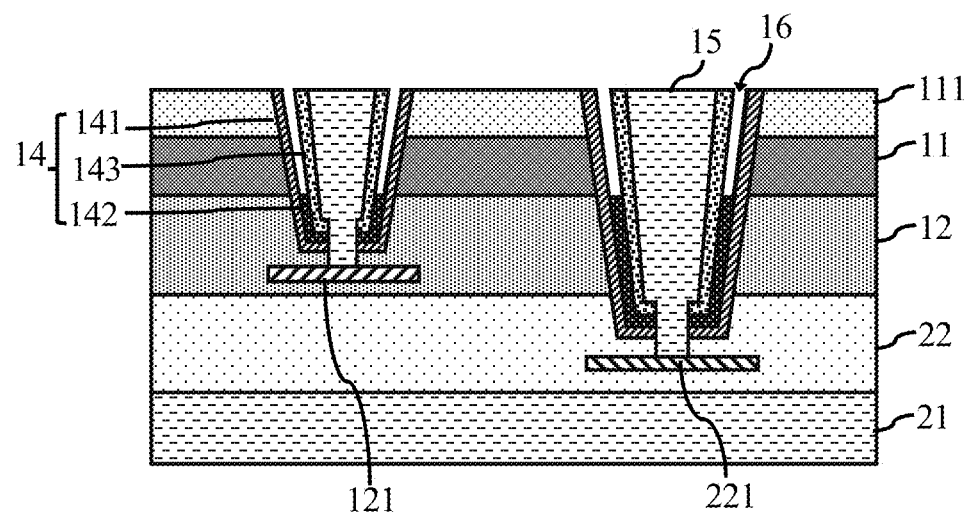

In step S5, referring to FIG. 2f, removing at least part of the insulating dielectric layer 14 situated in correspondence with the first substrate 11 in the depth and/or thickness dimension, forming an air gap 16 between the conductive layer 15 and the first substrate 11.

There may be air or vacuum in the air gap 16.

In case of the insulating dielectric layer 14 being a single-layer structure, at least part of the insulating dielectric layer 14 situated in correspondence with the first substrate 11 in the depth dimension may be removed, forming an air gap 16 in which both the first substrate 11 and the conductive layer 15 are exposed.

In case of the insulating dielectric layer 14 being a stack of at least two layers, a portion of any one layer or portions of two or more layers (including the case of all the layers) in the insulating dielectric layer 14 situated in correspondence with the first substrate 11 may be removed. Specifically, a portion of a partial thickness of the insulating dielectric layer 14 in contact with the first substrate 11 may be removed, with the remaining thickness of the insulating dielectric layer between the air gap 16 and the conductive layer 15 still covering the conductive layer 15, forming an air gap 16 in which the first substrate 11 is exposed. Alternatively, a portion of a partial thickness of the insulating dielectric layer 14 in contact with the conductive layer 15 may be removed, with the remaining thickness of the insulating dielectric layer 14 between the air gap 16 and the first substrate 11 still covering the first substrate 11, forming an air gap 16 in which the conductive layer 15 is exposed. Alternatively, a portion of the entire thickness of the insulating dielectric layer 14 situated in correspondence with the first substrate 11 may be removed, without any portion of the insulating dielectric layer 14 present in the air gap 16, forming an air gap 16 in which both the first substrate 11 and the conductive layer 15 are exposed. Alternatively, both a portion of a partial thickness of the insulating dielectric layer 14 in contact with the first substrate 11 and a portion of a partial thickness of the insulating dielectric layer 14 in contact with the conductive layer 15 may be removed, forming both an air gap 16 between the first substrate 11 and the remainder of the insulating dielectric layer 14 and an air gap 16 between the conductive layer 15 and the remainder of the insulating dielectric layer 14. Alternatively, a portion of a central partial thickness of the insulating dielectric layer 14 may be removed, forming an air gap 16 in which neither the first substrate 11 nor the conductive layer 15 is exposed, with a partial thickness of the insulating dielectric layer 14 remaining between the air gap 16 and the first substrate 11 and another partial thickness of the insulating dielectric layer 14 between the air gap 16 and the conductive layer 15.

Preferably, the conductive layer 15 is not exposed in the air gap 16 so that the insulating dielectric layer 14 remaining on the surface of the conductive layer 15 is able to block the diffusion of a metal from the conductive layer 15 into the first substrate 11, which may affect the performance of the semiconductor device being fabricated.

It is to be noted that, the removal of a partial thickness of the insulating dielectric layer 14 during the formation of the air gap 16 refers to the removal of one or more component layers in the insulating dielectric layer 14 over its whole extent situated in correspondence with the first substrate 11 or part thereof.

In case of the insulating dielectric layer 14 being implemented as a stack of at least two layers, if there is any high etching selectivity ratio (e.g., at least 7:1) between the constituent layers of the insulating dielectric layer 14, at least one layer with a relatively slow etching rate will survive from the etching process for forming the air gap 16. If the etching selectivity ratio(s) between the constituent layers of the insulating dielectric layer 14 is/are all low, then all these constituent layers of the insulating dielectric layer 14 between the first substrate 11 and the conductive layer 15 will be totally removed during the etching process for forming the air gap 16, resulting in the exposure of both the first substrate 11 and the conductive layer 15 in the resulting air gap 16.

In the exemplary embodiment shown in FIG. 2f with the insulating dielectric layer 14 being implemented as a tri-layer stack consisting of, sequentially stacked on the side wall of the hole, the first silicon oxide layer 141, the silicon nitride layer 142 and the second silicon oxide layer 143, a wet etching process using a phosphoric acid solution may be employed to remove a section of the silicon nitride layer 142 extending through a thickness of the insulating material layer 111 and at least part of a section of the silicon nitride layer 142 extending through a thickness of the first substrate 11. Due to a high etching selectivity ratio of silicon nitride to silicon oxide, during the etching removal of the silicon nitride layer 142, there will be almost no loss of the first silicon oxide layer 141 or the second silicon oxide layer 143. As a result, an air gap 16 is formed, which is separated from the first substrate 11 by the first silicon oxide layer 141 and separated from the conductive layer 15 by the second silicon oxide layer 143. In other implementations, other etching solutions (e.g., hydrofluoric acid) may be used to etch away the first silicon oxide layer 141 and the second silicon oxide layer 143 to form air gaps 16, with the silicon nitride layer 142 remaining between the first silicon oxide layer 141 and the second silicon oxide layer 143.

The etching process for etching the insulating dielectric layer and thus forming the air gap 16 may be either a wet or dry etching process. When a wet etching process is used, etching rate control may be carried out by adjusting a concentration or additive(s) of the used etching solution or a temperature or duration of the etching process. When a dry etching process is used, etching rate control may be carried out by adjusting the used etchant gas(es), a temperature or duration of the etching process or other parameter(s). By means of the etching rate control, the air gap 16 may be each formed at a desired location and have a desired size.

It is to be noted that, in order to avoid exerting an adverse impact on the performance of the semiconductor device being fabricated, the etching process for removing at least part of the insulating dielectric layer 14 situated in correspondence with the first substrate 11 may be selected to have an etching selectivity ratio allowing no or little loss of the conductive layer 15 and the first substrate 11.

In this step, replacing at least part of the insulating dielectric layer 14 situated in correspondence with the first substrate 11 with the air gap 16 containing air or vacuum that has a relative dielectric constant much lower than that of the material(s) of the insulating dielectric layer 14 results in a significant reduction in parasitic capacitance present between the first substrate 11, the conductive layer 15 and the component between the first substrate 11 and the conductive layer 15.

Partially removing the portion of the insulating dielectric layer 14 situated in correspondence with the first substrate 11 and thus separating the first substrate 11 from the conductive layer 15 over part of the portion's depth and/or thickness with the air gap 16 can result in a reduction in parasitic capacitance. Entirely removing the portion of the insulating dielectric layer 14 situated in correspondence with the first substrate 11 and thus separating the first substrate 11 from the conductive layer 15 throughout the portion with the air gap 16 can result in an even greater reduction in parasitic capacitance.

Figure 2G:
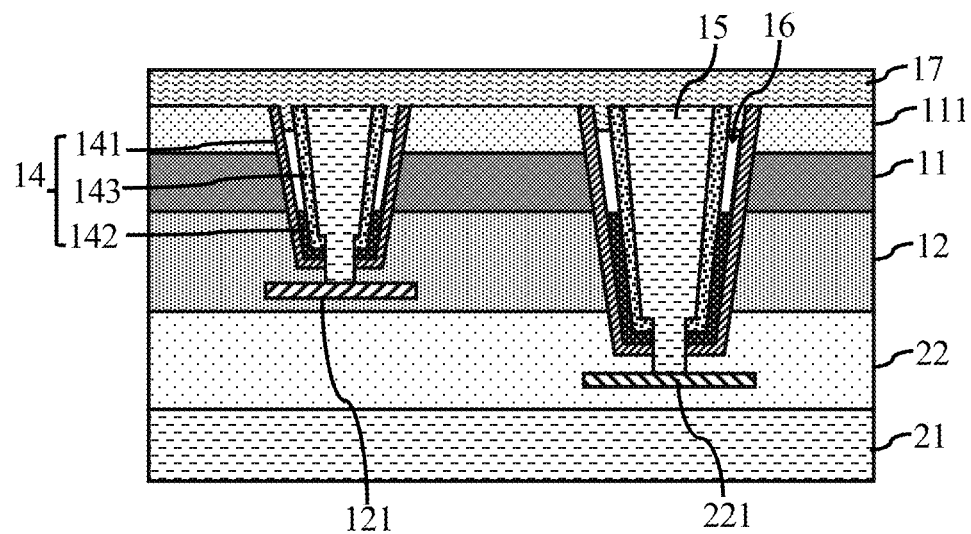

In step S6, referring to FIG. 2g, the closure layer 17 closing the air gap 16 is formed.

The closure layer 17 resides on the insulating material layer 111. Since each air gap 16 extends from between the conductive layer 15 and the insulating material layer 111 to between the conductive layer 15 and the first substrate 11 and has a very small width, the material of the closure layer 17 can only enter the section of the air gap 16 between the conductive layer 15 and the insulating material layer 111 and will not reach the section thereof between the conductive layer 15 and the first substrate 11 because the air gap 16 is closed at this time.

The material of the closure layer 17 may be either conductive or insulating.

Figure 3A:
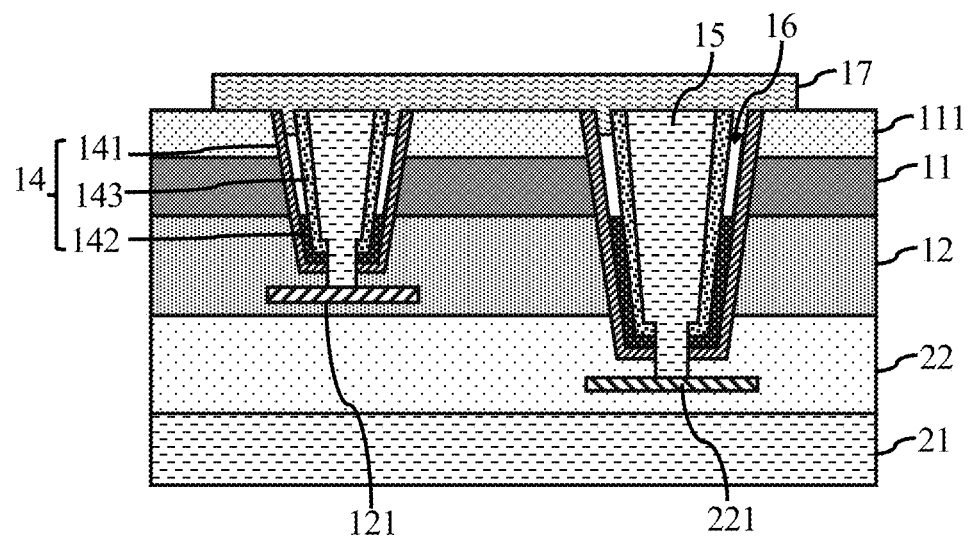
FIGS. 3a to 3c are schematic illustrations of a semiconductor device according to a particular embodiment of the present invention.
Figure 3B:
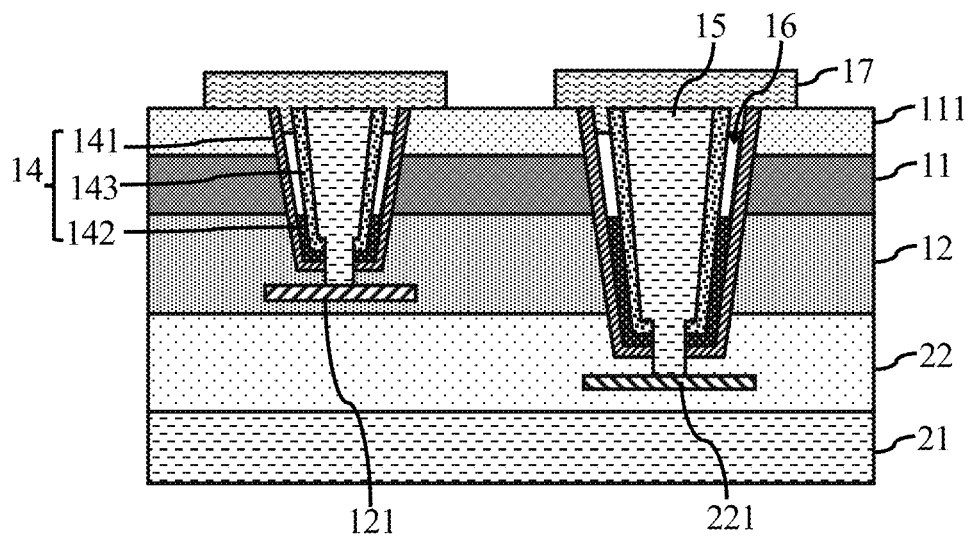

After the closure layer 17 is deposited on the insulating material layer 111, it may be etched and patterned as desired. In case of the closure layer 17 being a conductive material, it may be so patterned as to be brought into electrical connection, as a single piece, with the conductive layers 15 in different holes, such as the first and second holes 131, 132, as shown in FIG. 3a. Alternatively, it may be so patterned that its different sections are brought into electrical connection with the respective conductive layers 15 in the first and second holes 131, 132, which are insulated from each other, as shown in FIG. 3b. In case of the closure layer 17 being an insulating material, opening(s) (not shown) in which the conductive layer(s) 15 in the first hole 131 and/or the second hole 132 is/are exposed may be formed in the closure layer 17 by an etching process and a conductive material may be filled in the opening, as part of the formation of, for example, solder pad(s) or the like.

Figure 3C:
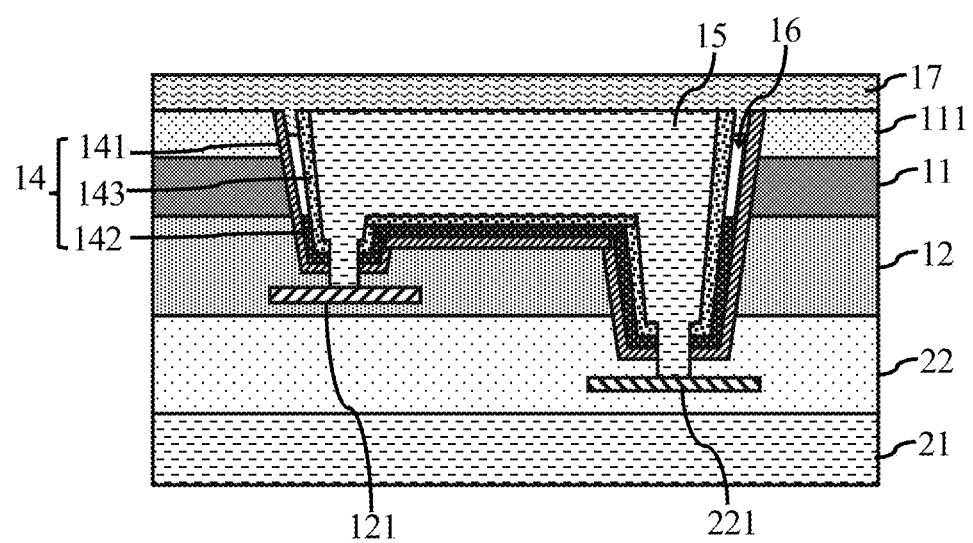

In the embodiments shown in FIGS. 2a to 2g and 3a to 3b, the first hole 131 is not brought into communication with the second hole 132. However, in other embodiments, the two holes 131, 132 may be brought into communication with each other, as shown in FIG. 3c.

In the above-discussed method, after a hole extending through the substrate of the first wafer is formed, an insulating dielectric layer covering a side wall of the hole is formed, and a conductive layer is filled in the hole. After that, at least part of the insulating dielectric layer situated in correspondence with the substrate is removed, resulting in the formation of an air gap between the conductive layer and the substrate. Replacing at least part of the insulating dielectric layer situated in correspondence with the substrate with the air gap having a lower dielectric constant results in a significant reduction in parasitic capacitance between the conductive layer, the insulating dielectric layer and the substrate and thus in an improvement in the performance of the semiconductor device being fabricated.

In embodiments of the present invention, there is also provided a semiconductor device including: a first substrate; a hole extending through the first substrate; an insulating dielectric layer covering a side wall of the hole; a conductive layer filled in the hole, wherein at least part of the insulating dielectric layer situated in correspondence with the first substrate is removed, forming an air gap between the conductive layer and the first substrate; and a closure layer closing the air gap.

The semiconductor device according to this embodiment will be described in greater detail below with reference to the schematic longitudinal cross-sectional views shown in FIGS. 3a to 3c.

The semiconductor device may include either one wafer or at least two wafers which are bonded together. The following description will be set forth in the context of two wafers bonded together as an example.

The semiconductor device may include a first wafer including the first substrate 11 and a first insulating layer 12 residing on a front side of the first substrate 11.

The first substrate 11 may be formed of any suitable semiconductor material. Examples of the material may include, but are not limited to, silicon, germanium, silicon germanium, silicon germanium carbide, silicon carbide and other semiconductor materials.

In the first insulating layer 12, there may be formed a first metal interconnect 121 and, optionally, a functional component such as a pixel array, a transistor or an MEMS device (e.g., a diaphragm, an electrode, etc.)

The first wafer may be a device wafer such as a pixel wafer containing a pixel array of an image sensor. The type of the first wafer is determined by functionality of the semiconductor device. A plurality of first dies arranged into an array may be formed on the first wafer.

The semiconductor device may further include a second wafer, to which the first wafer is bonded. The bonding of the first wafer to the second wafer may be accomplished by bonding layer(s) on the first wafer and/or the second wafer.

The second wafer may not contain any functional component, and may serve only to support the first wafer. Alternatively, the second wafer may also be a device wafer containing MOS transistors, resistors, capacitors, metal interconnects or other structures. The present invention is not limited to any particular material or device functionality of the second wafer.

The second wafer may include a second substrate 21 and a second insulating layer 22 on a front side of the second substrate 21. In the second insulating layer 22, there may be formed a second metal interconnect 221.

The first wafer may be so bonded to the second wafer that the first dies in the first wafer are aligned with and bonded to respective second dies on the second wafer to form an array of pairs of bonded dies.

The first wafer may be bonded to the second wafer so that the first insulating layer 12 is closer to the second wafer than the first substrate 11 or that the first substrate 11 is closer to the second wafer than the first insulating layer 12. Alternatively, the first wafer may be bonded to the second wafer so that the second insulating layer 22 is closer to the first wafer than to the second substrate 21 or that the second substrate 21 is closer to the first wafer than the second insulating layer 22.

The insulating material layer 111 may be formed on the side of the first wafer away from the second wafer.

In case of the first insulating layer 12 being closer to the second wafer than the first substrate 11, the hole may extend through at least the first substrate 11. That is, the hole may extend through the first substrate 11, or through the first substrate 11 and a partial thickness of the first insulating layer 12, or through the first substrate 11, the first insulating layer 12 and a partial thickness of the second wafer. In case of the hole (referred to hereinafter as the "first hole" (i.e., the first hole 131 shown in FIG. 2b) in order to be distinguished from holes formed in other embodiments) extending sequentially through the insulating material layer 111 and the first substrate 11 or through the insulating material layer 111, the first substrate 11 and a partial thickness of the first insulating layer 12, the first metal interconnect 121 may not be exposed in the first hole 131 (i.e., still separated from the first hole 131 by the remaining thickness of the first insulating layer 12). In this case, the insulating dielectric layer 14 covers both the side wall and a bottom wall of the first hole 131, and the semiconductor device may further include a first opening (i.e., the first opening 133 shown in FIG. 2d), which extends through the insulating dielectric layer 14 on the bottom wall of the first hole 131 and the first insulating layer 12 between the first hole 131 and the first metal interconnect 121 so that the first metal interconnect 121 is exposed therein.

Alternatively, in case of the hole ("second hole" (i.e., the second hole 132 shown in FIG. 2b) extending sequentially through the insulating material layer 111, the first substrate 11 and the first insulating layer 12 or through the insulating material layer 111, the first substrate 11, the first insulating layer 12 and a partial thickness of the second wafer, the second metal interconnect 221 may not be exposed in the second hole 132 (i.e., still separated from the second hole 132 by the remaining thickness of the second wafer), and if the second insulating layer 22 is closer to the first wafer than the second substrate 21, the second hole 132 may be separated from the second metal interconnect 221 by a partial thickness of the second insulating layer 22. In this case, the insulating dielectric layer 14 may cover both the side and bottom walls of the second hole 132, and the semiconductor device may further include a second opening (i.e., the second opening 134 shown in FIG. 2d), which extends through the insulating dielectric layer 14 on the bottom wall of the second hole 132 and the second wafer between the second hole 132 and the second metal interconnect 221 so that the second metal interconnect 221 is exposed therein. Only the first hole 131, only the second hole 132, or both the first and second holes 131, 132 may be formed in the first wafer.

In case of the first substrate 11 is closer to the second wafer than the first insulating layer 12, the hole may extend through the first insulating layer 12 and the first substrate 11 or through the first insulating layer 12, the first substrate 11 and a partial thickness of the second wafer. In case of the hole ("third hole", not shown) extending sequentially through the insulating material layer 111, the first insulating layer 12 and the first substrate 11 or through the insulating material layer 111, the first insulating layer 12, the first substrate 11 and a partial thickness of the second wafer, the second metal interconnect 221 may not be exposed in the third hole, and if the second insulating layer 22 is closer to the first wafer than the second substrate 21, then the third hole may be separated from the second metal interconnect 221 by a partial thickness of the second insulating layer 22. In this case, the insulating dielectric layer 14 may cover both the side and bottom walls of the third hole, and the semiconductor device may further include a third opening, which extends through the insulating dielectric layer 14 on the bottom wall of the second hole 132 and the second wafer between the third hole and the second metal interconnect 221 so that the second metal interconnect 221 is exposed therein.

It is to be noted that, in other embodiments, the first metal interconnect 121 may alternatively be exposed in the first hole 131, or the second metal interconnect 221 may alternatively be exposed in the second 132 or third hole. In this cases, the first 133, second 134 or third opening may only extend through the insulating dielectric layer 14 on the bottom wall of the first 131, second 132 or third hole.

The insulating dielectric layer 14 may be formed of a material selected as one or at least two of silicon oxide, silicon nitride, silicon oxynitride, nitrogen-doped silicon carbide and silicon carbide.

The insulating dielectric layer 14 may consist of either a single layer or a stack of at least two layers. In the embodiment illustrated in FIGS. 3a-3c, the insulating dielectric layer 14 is a tri-layer structure including a first silicon oxide layer 141, a silicon nitride layer 142 and a second silicon oxide layer 143, stacked sequentially on the side wall of the hole.

The conductive layer 15 is filled in the hole. As a result, when the conductive layer 15 is energized, parasitic capacitance will be present between the first substrate 11, the conductive layer 15 and the insulating dielectric layer 14 sandwiched by the first substrate 11 and the conductive layer 15.

The conductive layer 15 also fills the first opening 133, electrically connecting the conductive layer 15 in the first hole 131 and the first opening 133 to the first metal interconnect 121. Alternatively, the conductive layer 15 may also fill up the second opening 134, electrically connecting the conductive layer 15 in the second hole 132 and the second opening 134 to the second metal interconnect 221. Alternatively, the conductive layer 15 may also fill up the third opening, electrically connecting the conductive layer 15 in the third hole and the third opening to the second metal interconnect 221.

At least part of the insulating dielectric layer 14 situated in correspondence with the first substrate 11 in the depth and/or thickness dimension, forming the air gap 16 between the conductive layer 15 and the first substrate 11.

There may be air or vacuum in the air gap 16.

In case of the insulating dielectric layer 14 being a single-layer structure, at least part of the insulating dielectric layer 14 situated in correspondence with the first substrate 11 in the depth dimension may be removed, forming an air gap 16 in which both the first substrate 11 and the conductive layer 15 are exposed.

In case of the insulating dielectric layer 14 being a stack of at least two layers, a portion of any one layer or portions of two or more layers (including the case of all the layers) in the insulating dielectric layer 14 situated in correspondence with the first substrate 11 may be removed. Specifically, a portion of a partial thickness of the insulating dielectric layer 14 in contact with the first substrate 11 may be removed, with the remaining thickness of the insulating dielectric layer between the air gap 16 and the conductive layer 15 still covering the conductive layer 15, forming an air gap 16 in which the first substrate 11 is exposed. Alternatively, a portion of a partial thickness of the insulating dielectric layer 14 in contact with the conductive layer 15 may be removed, with the remaining thickness of the insulating dielectric layer between the air gap 16 and the conductive layer 15 still covering the first substrate 11, forming an air gap 16 in which the conductive layer 15 is exposed. Alternatively, a portion of the entire thickness of the insulating dielectric layer 14 situated in correspondence with the first substrate 11 may be removed, without any portion of the insulating dielectric layer 14 present in the air gap 16, forming an air gap 16 in which both the first substrate 11 and the conductive layer 15 are exposed. Alternatively, both a portion of a partial thickness of the insulating dielectric layer 14 in contact with the first substrate 11 and a portion of a partial thickness of the insulating dielectric layer 14 in contact with the conductive layer 15 may be removed, forming both an air gap 16 between the first substrate 11 and the remainder of the insulating dielectric layer 14 and an air gap 16 between the conductive layer 15 and the remainder of the insulating dielectric layer 14. Alternatively, a portion of a central partial thickness of the insulating dielectric layer 14 may be removed, forming an air gap 16 in which neither the first substrate 11 nor the conductive layer 15 is exposed, with a partial thickness of the insulating dielectric layer 14 remaining between the air gap 16 and the first substrate 11 and another partial thickness of the insulating dielectric layer 14 between the air gap 16 and the conductive layer 15.

Preferably, the conductive layer 15 is not exposed in the air gap 16 so that the insulating dielectric layer 14 remaining on the surface of the conductive layer 15 is able to block the diffusion of a metal from the conductive layer 15 into the first substrate 11, which may affect the performance of the semiconductor device being fabricated.

It is to be noted that, the removal of a partial thickness of the insulating dielectric layer 14 during the formation of the air gap 16 refers to the removal of one or more component layers in the insulating dielectric layer 14 over its whole extent situated in correspondence with the first substrate 11 or part thereof.

In the embodiment shown in FIGS. 3a to 3c with the insulating dielectric layer 14 being implemented as a trilayer stack consisting of, sequentially stacked on the side wall of the hole, the first silicon oxide layer 141, the silicon nitride layer 142 and the second silicon oxide layer 143, a section of the silicon nitride layer 142 extending through a thickness of the insulating material layer 111 and at least part of a section of the silicon nitride layer 142 extending through a thickness of the first substrate 11 are removed, forming an air gap 16, which is situated in the silicon nitride layer 142 of the insulating dielectric layer 14, separated from the first substrate 11 by the first silicon oxide layer 141 and separated from the conductive layer 15 by the second silicon oxide layer 143. In other implementations, the first silicon oxide layer 141 and the second silicon oxide layer 143 may be both partially removed, forming air gaps 16, with the silicon nitride layer 142 remaining therebetween.

Replacing at least part of the insulating dielectric layer 14 situated in correspondence with the first substrate 11 with the air gap 16 containing air or vacuum that has a relative dielectric constant much lower than that of the material(s) of the insulating dielectric layer 14 results in a significant reduction in parasitic capacitance present between the first substrate 11, the conductive layer 15 and the component between the first substrate 11 and the conductive layer 15.

Partially removing the portion of the insulating dielectric layer 14 situated in correspondence with the first substrate 11 and thus separating the first substrate 11 from the conductive layer 15 over part of the portion's depth and/or thickness with the air gap 16 can result in a reduction in parasitic capacitance. Entirely removing the portion of the insulating dielectric layer 14 situated in correspondence with the first substrate 11 and thus separating the first substrate 11 from the conductive layer 15 throughout the portion with the air gap 16 can result in an even greater reduction in parasitic capacitance. The closure layer 17 is provided to close the air gap 16.

In case of the first insulating layer 12 being closer to the second wafer than the first substrate 11, the closure layer 17 may directly reside on the first substrate 11. If the first substrate 11 is closer to the second wafer than the first insulating layer 12, the closure layer 17 may be separated from the first substrate 11 by the first insulating layer 12.

In case of the first wafer being provided thereon with the insulating material layer 111, the closure layer 17 may reside on the insulating material layer 111. Since each air gap 16 has a very small width, the material of the closure layer 17 can only enter the section of the air gap 16 between the conductive layer 15 and the insulating material layer 111 and will not reach the section of the air gap 16 between the conductive layer 15 and the first substrate 11 because the air gap 16 is closed at this time.

The material of the closure layer 17 may be either conductive or insulating.

In case of the closure layer 17 being a conductive material, it may be so etched as to be brought into electrical connection, as a single piece, with the conductive layers 15 in different holes, such as the first and second holes 131, 132, as shown in FIG. 3a. Alternatively, it may be so etched that its different sections are brought into electrical connection with the respective conductive layers 15 in the first and second holes 131, 132, which are insulated from each other, as shown in FIG. 3b. In case of the closure layer 17 being an insulating material, opening(s) (not shown) in which the conductive layer(s) 15 in the first hole 131 and/or the second hole 132 is/are exposed may be formed in the closure layer 17 by an etching process and a conductive material may be filled in the opening, as part of the formation of, for example, solder pad(s) or the like.

In the embodiment shown in FIGS. 3a to 3b, the first hole 131 is not brought into communication with the second hole 132. However, in other embodiments, the two holes 131, 132 may be brought into communication with each other, as shown in FIG. 3c.

Further, the single wafer or bonded wafers in the semiconductor device may be diced into individual dies, which may be then subject to packaging and other subsequent processes to form individual chips.

In the illustrated embodiment, the first and second wafers that are bonded together may be diced into individual dies each containing a pair of bonded first and second dies, which may be then subject to packaging and other subsequent processes to form individual chips. The bonded wafers and the dies each containing a pair of bonded first and second dies both have the layered structure shown in FIGS. 3a to 3c.

In the above-discussed semiconductor device, a hole extending through the first substrate is formed, and a side wall of the hole is covered with an insulating dielectric layer. A conductive layer is filled in the hole, and at least part of the insulating dielectric layer situated in correspondence with the substrate is removed, resulting in the formation of an air gap between the conductive layer and the substrate. Replacing at least part of the insulating dielectric layer situated in correspondence with the substrate with the air gap having a lower dielectric constant results in a significant reduction in parasitic capacitance between the conductive layer, the insulating dielectric layer and the substrate and thus in an improvement in the performance of the semiconductor device.

The foregoing description presents merely preferred embodiments of the present invention and is not intended to limit the scope of the present invention in any sense. It is intended that all changes and modifications made by those of ordinary skill in the art in light of the above teachings fall within the scope of the appended claims.

What is claimed is:

1. A method of fabricating a semiconductor device, the method comprising:
providing a first wafer including a substrate;
forming a hole in the first wafer, which extends through the substrate;
forming an insulating dielectric layer over a side wall of the hole;
filling the hole with a conductive layer to dispose the insulating dielectric layer formed outside of the conductive layer and sandwiched between the substrate and the conductive layer;
removing at least part of the insulating dielectric layer situated in correspondence with the substrate, forming an air gap between the conductive layer and the substrate; and
forming a closure layer, which closes the air gap,
wherein the air gap is formed outside of the conductive layer, and disposed in the insulating electric layer that is sandwiched between the substrate and the conductive layer, resulting in a significant reduction in parasitic capacitance between the conductive layer, the insulating dielectric layer and the substrate.

2. The method of claim 1, wherein the insulating dielectric layer is a single-layer structure or a stack of at least two layers.

3. The method of claim 2, wherein in case of the insulating dielectric layer being a stack of at least two layers, a portion of any one of the at least two layers situated in correspondence with the substrate is removed.

4. The method of claim 3, wherein the insulating dielectric layer comprises, stacked sequentially over the side wall of the hole, a first silicon oxide layer, a silicon nitride layer and a second silicon oxide layer, and wherein a portion of the silicon nitride layer in the insulating dielectric layer in correspondence with the substrate is removed.

5. The method of claim 1, wherein in the air gap, the substrate is exposed, or the conductive layer is exposed, or both the substrate and the conductive layer are exposed.

6. The method of claim 1, wherein in the air gap, neither the substrate nor the conductive layer is exposed.

7. The method of claim 1, wherein there is no conductive layer between the air gap and the substrate.

8. The method of claim 1, prior to the formation of the hole in the first wafer, the method further comprising providing a second wafer and bonding the first wafer to the second wafer.

9. The method of claim 8, further comprising forming a further hole in the second wafer, the hole in the first wafer is not brought into communication with the further hole in the second wafer, or the hole in the first wafer is brought into communication with the further hole in the second wafer.

10. The method of claim 1, wherein forming an insulating dielectric layer over a side wall of the hole comprises:
forming an insulating dielectric layer covering both the side wall and a bottom wall of the hole;
etching away a portion of the insulating dielectric layer on the bottom wall of the hole.

11. The method of claim 9, further comprising:
providing a first insulating layer on a front side of the substrate in the first wafer and providing a second insulating layer on a front side of a substrate in the second wafer, the first insulating layer having a first metal interconnect formed therein, the second insulating layer having a second metal interconnect formed therein;
forming a first opening by etching away the insulating dielectric layer on a bottom wall of the hole in the first wafer and forming a second opening by etching away the insulating dielectric layer on a bottom wall of the further hole in the second wafer,
the conductive layer filling the first opening, electrically connecting the conductive layer in the hole and the first opening to the first metal interconnect, the conductive layer further filling the second opening, electrically connecting the conductive layer in the further hole and the second opening to the second metal interconnect.

12. A semiconductor device, comprising:
a first substrate;
a hole extending through the first substrate;
an insulating dielectric layer covering a side wall of the hole;
a conductive layer filled in the hole, wherein the insulating dielectric layer is formed outside of the conductive layer and is sandwiched between the substrate and the conductive layer, wherein at least part of the insulating dielectric layer in correspondence with the substrate is removed, forming an air gap between the conductive layer and the substrate; and
a closure layer, which closes the air gap,
wherein the air gap is formed outside of the conductive layer, and disposed in the insulating dielectric layer that is sandwiched between the substrate and the conductive layer, resulting in a significant reduction in parasitic capacitance between the conductive layer, the insulating dielectric layer and the first substrate.

13. The semiconductor device of claim 12, wherein the insulating dielectric layer is a single-layer structure or a stack of at least two layers.

14. The semiconductor device of claim 13, wherein in case of the insulating dielectric layer being a stack of at least two layers, a portion of any one of the at least two layers situated in correspondence with the substrate is removed so that the air gap is present in this layer.

15. The semiconductor device of claim 14, wherein the insulating dielectric layer comprises, stacked sequentially over the side wall of the hole, a first silicon oxide layer, a silicon nitride layer and a second silicon oxide layer, and wherein the air gap is present in the silicon nitride layer in the insulating dielectric layer.

16. The semiconductor device of claim 12, wherein in the air gap, the substrate is exposed, or the conductive layer is exposed, or both the substrate and the conductive layer are exposed.

17. The semiconductor device of claim 12, wherein in the air gap, neither the substrate nor the conductive layer is exposed.

18. The semiconductor device of claim 12, wherein there is no conductive layer between the air gap and the substrate.

19. The semiconductor device of claim 12, further comprising:
a first die containing the first substrate; and
a second die bonded to the first die.

20. The semiconductor device of claim 12, wherein there is air or vacuum in the air gap.

* * * * *